United States Patent
Zhu

(10) Patent No.: US 6,878,958 B2
(45) Date of Patent: Apr. 12, 2005

(54) VERTICAL CAVITY SURFACE EMITTING LASER WITH BURIED DIELECTRIC DISTRIBUTED BRAGG REFLECTOR

(75) Inventor: Zuhua Zhu, San Jose, CA (US)

(73) Assignee: Gazillion Bits, Inc., San Jose, CA (US)

( * ) Notice: Subject to any disclaimer, the term of this patent is extended or adjusted under 35 U.S.C. 154(b) by 51 days.

(21) Appl. No.: 10/106,929

(22) Filed: Mar. 26, 2002

(65) Prior Publication Data

US 2002/0173089 A1 Nov. 21, 2002

Related U.S. Application Data

(60) Provisional application No. 60/278,724, filed on Mar. 26, 2001, and provisional application No. 60/278,715, filed on Mar. 26, 2001.

(51) Int. Cl.[7] .................... H01L 29/06; H01L 31/072; H01L 31/109; H01L 31/0328; H01L 31/0336
(52) U.S. Cl. ............................ 257/12; 257/37
(58) Field of Search .................. 257/12, 14, 16, 257/22, 37

(56) References Cited

U.S. PATENT DOCUMENTS

| | | | |
|---|---|---|---|
| 4,522,662 A | 6/1985 | Bradbury et al. | |
| 5,283,447 A | 2/1994 | Olbright et al. | |
| 5,482,891 A | 1/1996 | Shieh et al. | |
| 5,547,898 A | 8/1996 | Grodzinski et al. | |
| 5,557,627 A | 9/1996 | Schneider, Jr. et al. | |
| 5,654,228 A | 8/1997 | Shieh et al. | |
| 5,661,075 A | 8/1997 | Grodzinski et al. | |
| 5,712,865 A | 1/1998 | Chow et al. | |
| 5,719,892 A | 2/1998 | Jiang et al. | |
| 5,719,894 A | 2/1998 | Jewell et al. | |
| 5,719,895 A | 2/1998 | Jewell et al. | |
| 5,742,630 A | 4/1998 | Jiang et al. | |
| 5,825,796 A | 10/1998 | Jewell et al. | |
| 5,835,521 A | 11/1998 | Ramdani et al. | |
| 5,838,707 A | 11/1998 | Ramdani et al. | |
| 5,838,715 A | 11/1998 | Corzine et al. | |
| 5,912,913 A * | 6/1999 | Kondow et al. | ............... 372/45 |

(Continued)

FOREIGN PATENT DOCUMENTS

EP       1026798       8/2000

OTHER PUBLICATIONS

Wilmsen et. al., eds., *Vertical Cavity Surface Emitting Lasers: Design, Fabrication, Characterization, and Applications*, Cambridge University Press (1999).

(Continued)

*Primary Examiner*—Phuc T. Dang
(74) *Attorney, Agent, or Firm*—Cooper & Dunham LLP

(57) ABSTRACT

A vertical cavity surface-emitting laser (VCSEL) structure and related fabrication methods are described, the VCSEL comprising amorphous dielectric distributed Bragg reflectors (DBRs) while also being capable of fabrication in a single-growth process. Beginning with a substrate such as InP, a first amorphous dielectric DBR structure is deposited thereon, but is limited in width such that some substrate material remains uncovered by the dielectric material. A lateral overgrowth layer is then formed by epitaxially growing material such as InP onto the substrate, the lateral overgrowth layer eventually burying the dielectric DBR structure as well as the previously-uncovered substrate material. Active layers may then be epitaxially grown on the lateral overgrowth layer, and a top dielectric DBR may be deposited thereon using conventional techniques. To save vertical space between DBRs, the first DBR may be deposited in a non-reentrant well formed in the surface of a substrate. A dual lateral overgrowth method for further reducing dislocations above a lower buried dielectric DBR of a VCSEL is also described.

5 Claims, 8 Drawing Sheets

U.S. PATENT DOCUMENTS

| | | | |
|---|---|---|---|
| 5,943,357 A | 8/1999 | Lebby et al. | |
| 5,956,363 A | 9/1999 | Lebby et al. | |
| 5,960,018 A | 9/1999 | Jewell et al. | |
| 5,960,024 A | 9/1999 | Li et al. | |
| 5,974,071 A | 10/1999 | Jiang et al. | |
| 6,021,146 A | 2/2000 | Jiang et al. | |
| 6,021,147 A | 2/2000 | Jiang et al. | |
| 6,026,111 A | 2/2000 | Jiang et al. | |
| 6,061,380 A | 5/2000 | Jiang et al. | |
| 6,091,754 A | 7/2000 | Jiang et al. | |
| 6,111,276 A | 8/2000 | Mauk | |
| 6,121,068 A | 9/2000 | Ramdani et al. | |
| 6,122,109 A | 9/2000 | Peake et al. | |
| 6,154,589 A | 11/2000 | Kirk et al. | |
| 6,160,833 A | 12/2000 | Floyd et al. | |
| 6,177,359 B1 | 1/2001 | Chen et al. | |
| 6,185,241 B1 | 2/2001 | Sun | |
| 6,233,267 B1 * | 5/2001 | Nurmikko et al. | 372/46 |

OTHER PUBLICATIONS

Unhold et.al., "Improving Single–Mode VCSEL Performance by Introducing Long Monolithic Cavity," IEEE Photonics Technology Letters, vol. 12, No. 8 (Aug. 2000).

Yariv, A., *Introduction to Optical Electronics,* Holt Rinehart and Winston (1976).

Adachi et. al., "Chemical Etching Characteristics of (001) InP," J. Electrochem. Soc., vol. 128, pp. 342–1349 (1981).

Liau et. al., "Surface–Emitting GaInAsP/InP Laser With Low Threshold Current and High Efficiency," Applied Physics Letters, vol. 46, pp. 115–117 (1985).

Strzelecka et. al, "Fabrication of Refractive Microlenses in Semiconductors by Mask Shape Transfer in Reactive Ion Etching," Microelectronic Engineering, vol. 35, pp. 385–388 (1997).

Anan, T. et. al., "Room temperature pulsed operation of GaAsSb/GaAs vertical–cavity surface–emitting lasers", Electronics Letters, vol. 35, pp. 903–904 (1999).

Babic, "Double–fused 1.52um vertical–cavity lasers," Appl. Phys. Lett., vol. 66, p. 1030 (1995).

Bhattacharay, P. et. al., "A 1.55 µm Pattered Vertical Cavity Laser With Mismatched Mirrors," LEOS Newsletter, pp. 4–6 (Aug. 1999).

Cheng and Dutta, eds., *Vertical–Cavity Surface–Emitting Lasers; Technology and Applications, vol. 10 of Optoelectronic Properties of Semiconductors and Superlattices,* Manasreh, ed., Gordon and Breach Science Publishers (2000).

Choquette, K.D. et. al., "Coupled Resonator Vertical Cavity Laser Diodes," LEOS Newsletter, pp. 6–7 (Aug. 1999).

Chua et. al., "Planar laterally oxidized vertical–cavity lasers for low threshold high density top surface emitting arrays", IEEE Photonics Technology. Letters., vol. 9, pp. 1060–1061, (1997).

Dutton, Understanding *Optical Communications* (Prentice Hall 1998), at pp. 159–161.

Ell, C. et. al. "Toward Quantum Entanglement in a Quantum–Dot Nanocavity," LEOS Newsletters, pp. 8–9 (Aug. 1999).

Hall, E., et. al., "Epitaxial Long Wavelength DBRs on InP: AlAsSb or Lateral Oxidation," LEOS Newsletter, pp. 10–11 (Aug. 1999).

Jayaraman, V. et. al. "Uniform threshold current, continuous wave, single–mode 1300nm vertical cavity lasers from 0–70C," Electronics Letters., vol. 34, pp. 1405–1407, (1998).

Jayaraman, V. et. al., "High Temperature 1300 nm VCSELs for Single–Mode Fiber–Optic Communications," LEOS Newsletter, pp. 11–12 (Aug. 1999).

Kondow, M. et. al., "GaInAsN: A novel material for long wavelength range laser diodes with excellent high–temperature performance", et al, Japan J. Appl. Phys., vol. 35, p. 1273–1275, (1996).

Kung, P. et. al., "Lateral epitaxial overgrowth of GaN films on sapphire and silicon substrates," Applied Physics Letters, vol. 74, No. 4, pp. 570–572 (1999).

Laser Components GmbH, "Specdilas V–Series Single–Mode Laserdiode Low Threshold Current," 2–page technical specification document, Laser Components GmbH, Olching, Germany (Jun. 2000).

Lei, C. et. al. "ZnSe/CaF2 quarter wave Bragg reflector for the vertical–cavity surface–emitting laser," J. Appl. Phys., vol. 69, pp. 7430–7434 (1991).

Lei, C. et. al., "Manufacturing of Oxide VCSEL at Hewlett–Packard," LEOS Newsletter, pp. 12–13 (Aug. 1999).

Naone, R.L. et. al., "Tapered–Apertures for High–Efficiency Miniature VCSELs," LEOS Newsletter, pp. 13–14 (Aug. 1999).

Naritsuka, S. et. al., "InP layer grown on (001) Silicon substrate by epitaxial lateral overgrowth" Jpn. J. Appl. Phys. vol. 34, pp. L1432–L1435 (1995).

Ohmachi, Y. et. al., "GaAs/Ge Crystal growth on Si and $SiO_2$ substrates," Mat. Res. Soc. Symposium Proc. vol. 67, pp. 63–75 (1986).

Park, J., "Lateral overgrowth and epitaxial lift–off of InP by halide vapor–phase epitaxy," J. Crystal Growth, vol. 187, pp. 185–193 (1998).

Sale, T.E., *Vertical Cavity Surface Emitting Lasers,* Wiley & Sons (1995).

Sun, Y. "Temporally resolved growth of InP in the openings of off–orientation from [110] direction," 2000 International Conference on Indium Phosphide and Related Materials, pp. 227–230 (2000) (abstract only).

Uchiyama, S. et. al., "Continuous–Wave Operation up to 36C of 1.3 µm GaInAsP–InP Vertical–Cavity Surface–Emitting Lasers," IEEE Photonics Technology Letters, vol. 9, No. 2, pp. 141–142 (Feb. 1997).

Zah, C.E., "High–performance uncooled 1.3um AlxGayIn1–x–yAs/InP strained–layer quantum–well lasers for subscriber loop applications," IEEE J. Quantum Electron., vol. 30, pp. 511–523 (1994).

Zilko, "Effect of mesa shape on the planarity of InP regrowths performed by atmospheric pressure and low pressure selective metalorganic vapor phase epitaxy," J. Crystal Growth, vol. 109, pp. 264–271 (1991).

Hahn et al., "VCSEL–Based Fiber–Optic Data Communications," from *Vertical Cavity Surface Emitting Lasers: Design Fabrication, Characterization, and Applications.*

Kasahara, "Optical Interconnection Applications and Required Characteristics," from *Vertical Cavity Surface Emitting Lasers: Design Fabrication, Characterization, and Applications*.

Coldren et al., "Introduction to VCSELs," from *Vertical Cavity Surface Emitting Lasers: Design Fabrication, Characterization, and Applications*.

Babic et al., "Long–Wavelength Vertical–Cavity Lasers," from *Vertical Cavity Surface Emitting Lasers: Design Fabrication, Characterization, and Applications*.

U.S. Appl. No. 10/106,991 filed Mar. 26, 2002.

U.S. Appl. No. 09/927,802 filed Aug. 10, 2001.

* cited by examiner

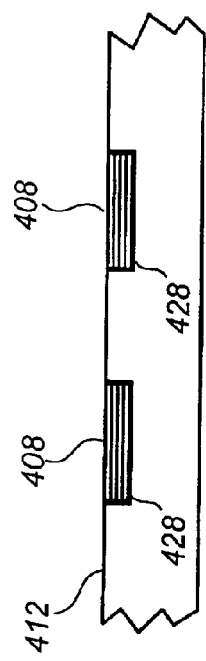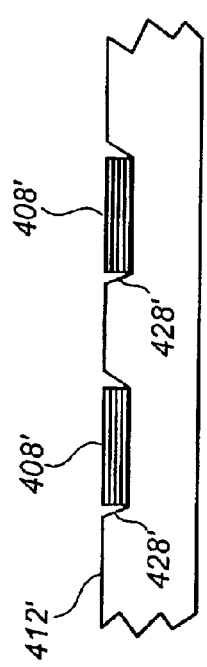

VERTICAL CAVITY SURFACE EMITTING LASER WITH BURIED DIELECTRIC DISTRIBUTED BRAGG REFLECTOR

CROSS-REFERENCE TO RELATED APPLICATIONS

This application claims the benefit of Provisional Application Ser. No. 60/278,724, filed Mar. 26, 2001 and a Provisional Application Ser. No. 60/278,715, filed Mar. 26/2001, which is incorporated by reference herein.

FIELD

This patent specification relates to vertical cavity surface emitting lasers (VCSELs). More particularly, it relates to single-growth VCSELs having amorphous dielectric distributed Bragg reflectors (DBRs).

BACKGROUND

Solid-state semiconductor lasers represent desirable light sources for a variety of applications including optical data communications, telecommunications, and other applications. A vertical cavity surface emitting laser (VCSEL) is a solid-state semiconductor laser in which light is emitted from the surface of a monolithic structure of semiconductor layers, in a direction normal to the surface. This is in contrast to the more commonly used edge-emitting laser, in which light is emitted from the edge of the wafer. Whereas edge-emitting lasers rely on facet mirrors formed at the wafer edge by cleaving or dry etching, the operation of VCSELs is enabled through the use of distributed Bragg reflector (DBR) mirrors for longitudinal optical confinement. VCSELs are advantageous over edge-emitting lasers in that (i) they have a lower-divergence, circularly-shaped laser beam, (ii) may be manufactured using standard fabrication processes such as those used in silicon VLSI technology, (iii) may be tested at the wafer level prior to packaging, and (iv) may be fabricated in dense 2-dimensional arrays for lower cost and higher volume.

As in any laser, the overall structure of a VCSEL is one of two end mirrors on each side of an active region, the active region producing the light responsive to an electric current therethrough. However, the active region is a thin semiconductor structure, and the end mirrors are distributed Bragg reflector mirrors ("DBR mirrors") comprising alternating layers of differently-indexed material such that light of only the desired wavelengths is reflected. Further general information on VCSELs may be found in the following references, each of which is incorporated by reference herein: Cheng and Dutta, eds., *Vertical-Cavity Surface-Emitting Lasers: Technology and Applications*, Vol. 10 of Optoelectronic Properties of Semiconductors and Superlattices, Manasreh, ed., Gordon and Breach Science Publishers (2000); Sale, T. E., *Vertical Cavity Surface Emitting Lasers*, Wiley & Sons (1995); and Dutton, *Understanding Optical Communications* (Prentice Hall 1998), at pp. 159–161.

As described in Dutton, supra at p. 160, short-wavelength VCSELs having output wavelengths of 850 nm and 980 nm are readily amenable to low-cost fabrication methods, with four separate manufacturers offering low-cost VCSELs by 1998. Commonly, short wavelength VCSELs comprise an active region based on a material system of $Al_xGa_{1-x}As/GaAs$ (for 850 nm) or $In_xGa_{1-x}As/GaAs$ (for 980 nm), as well as DBR mirrors that are also based on alternating layers of $Al_xGa_{1-x}As/GaAs$. Importantly, such materials for the active region and DBRs are well conformed to each other from a lattice-matching perspective or, if there is a slight mismatch, the resulting strains are desirable ones, as in the case of strained multi-quantum-well (MQW) active layer structures. Thus, for the short-wavelength devices, epitaxial growth of an entire vertical VCSEL structure is readily achieved. Accordingly, short wavelength VCSELs are readily grown in a single-growth process in which, starting with a substrate wafer, successive layers are epitaxially grown (e.g., using molecular beam epitaxy, vapor phase epitaxy, etc.) in a single sweep until the wafer is complete.

Single-growth VCSEL fabrication methods stand in contrast to more complex fabrication methods that are required when, due to nonconformance of DBR material with the active region material system, or due to the presence of complex structures, two or more wafers must be separately fabricated and then fused or bonded together. In addition to the cost and complexity of the multiple wafer growth and bonding process, the results are often less satisfactory than the results of single-growth processes due to the possibilities of mismatches, boundary oxidation, active layer thermal/stress damage, or other singularities along the component wafer boundaries that may lead to reduced device performance and/or reduced device reliability.

Unfortunately, the fabrication of long-wavelength VCSELs (e.g., 1300 nm and 1550 nm) for use in long-distance telecommunications applications has introduced many problems not encountered with short-wavelength VCSELs. One significant problem lies in the lack of availability of suitable DBR materials that conform to known long-wavelength active region material systems. For example, where an InGaAsP/InP material system is used for the active region, it has been found that the use of alternating layers of InGaAsP/InP cannot be readily used for the DBR portion of the VCSEL. This is because the refractive index difference between InGaAsP and InP is relatively small, causing an impractically thick DBR region to be required.

One attempt to solve this problem is discussed in U.S. Pat. No. 6,121,068, which is incorporated by reference herein. In the '068 patent, an InGaAsP/InP material system is used for the active region, whereas alternating layers of $SiO_2$/Si, which are dielectric materials, are used for the DBR regions. These dielectric materials are used instead of alternating layers of InGaAsP/InP, which are semiconductor materials. Because of the more substantial refractive index difference between the $SiO_2$ and the Si layers, a lesser and more practical DBR thickness is realized. However, because the dielectric material has no lattice structure, it may not be epitaxially grown on the substrate material. Instead, a multiple-growth process followed by a wafer bonding process is used. As discussed supra, wafer bonding processes may bring about several disadvantages with respect to device performance and/or reliability.

Another attempt to solve the DBR thickness problem in long wavelength VCSELs is discussed in Babic, "Double-fused 1.52 um vertical-cavity lasers," Appl. Phys. Lett., vol. 66, p. 1030 (1995), which is incorporated by reference herein, in which alternating layers of AlAs/GaAs are used to form the DBRs. Because the of the more substantial refractive index difference between the AlAs and the GaAs layers, a lesser and more practical DBR thickness is realized. However, because of nonconformities between these materials with respect to the InP substrate material, epitaxial growth of the DBR layers is not practical, and a multiple-growth and wafer bonding process is used to form the VCSEL that may likewise bring about several disadvantages with respect to device performance and/or reliability.

Accordingly, it would be desirable to provide a long-wavelength VCSEL structure that may be fabricated using a single-growth technique. It would be further desirable to provide a VCSEL structure that would be readily adaptable to the use of different materials for the DBR mirrors having differing distances between the DBR layers and other portions of the VCSEL laser cavity.

SUMMARY

According to a preferred embodiment, a VCSEL structure and fabrication method therefor are provided, the VCSEL comprising dielectric DBRs while also being capable of fabrication in a single-growth process. Beginning with a substrate such as InP, a first dielectric DBR structure is deposited thereon, but is limited in width such that some substrate material remains uncovered by the dielectric material. A lateral overgrowth layer is then formed by epitaxially growing material such as InP, doped InP, or other material onto the substrate, the lateral overgrowth layer eventually burying the dielectric DBR structure as well as the previously-uncovered substrate material. Active layers may then be epitaxially grown on the lateral overgrowth layer using conventional techniques. A single-growth VCSEL is thereby achieved despite the presence of a dielectric DBR structure therein.

The above preferred embodiment is particularly advantageous for long-wavelength VCSELs in which larger cavity lengths between the DBRs may be tolerated, because there is adequate vertical space for allowing the lateral overgrowth region to achieve planarity when growing over the dielectric DBR. In an alternative preferred embodiment in which less vertical space is available for achieving such planarity when growing over the DBR, the substrate is vertically etched to form a well structure prior to deposition of the dielectric DBR. The dielectric DBR is then deposited in the well structure, and the lateral overgrowth layer is then formed over the dielectric DBR and substrate. In still another preferred embodiment in which less vertical space is available for burying the dielectric DBR, a chemical-mechanical polishing process may be performed on the lateral overgrowth layer to reduce its thickness. Although a long wavelength VCSEL structure is described herein, the features and advantages of the preferred embodiments may be applied to any VCSEL structure in which one or more dielectric DBR's are used.

BRIEF DESCRIPTION OF THE DRAWINGS

FIGS. 5A and 5B illustrate substrate wells with dielectric DBRs deposited therein according to a preferred embodiment;

DESCRIPTION

Figure 1:
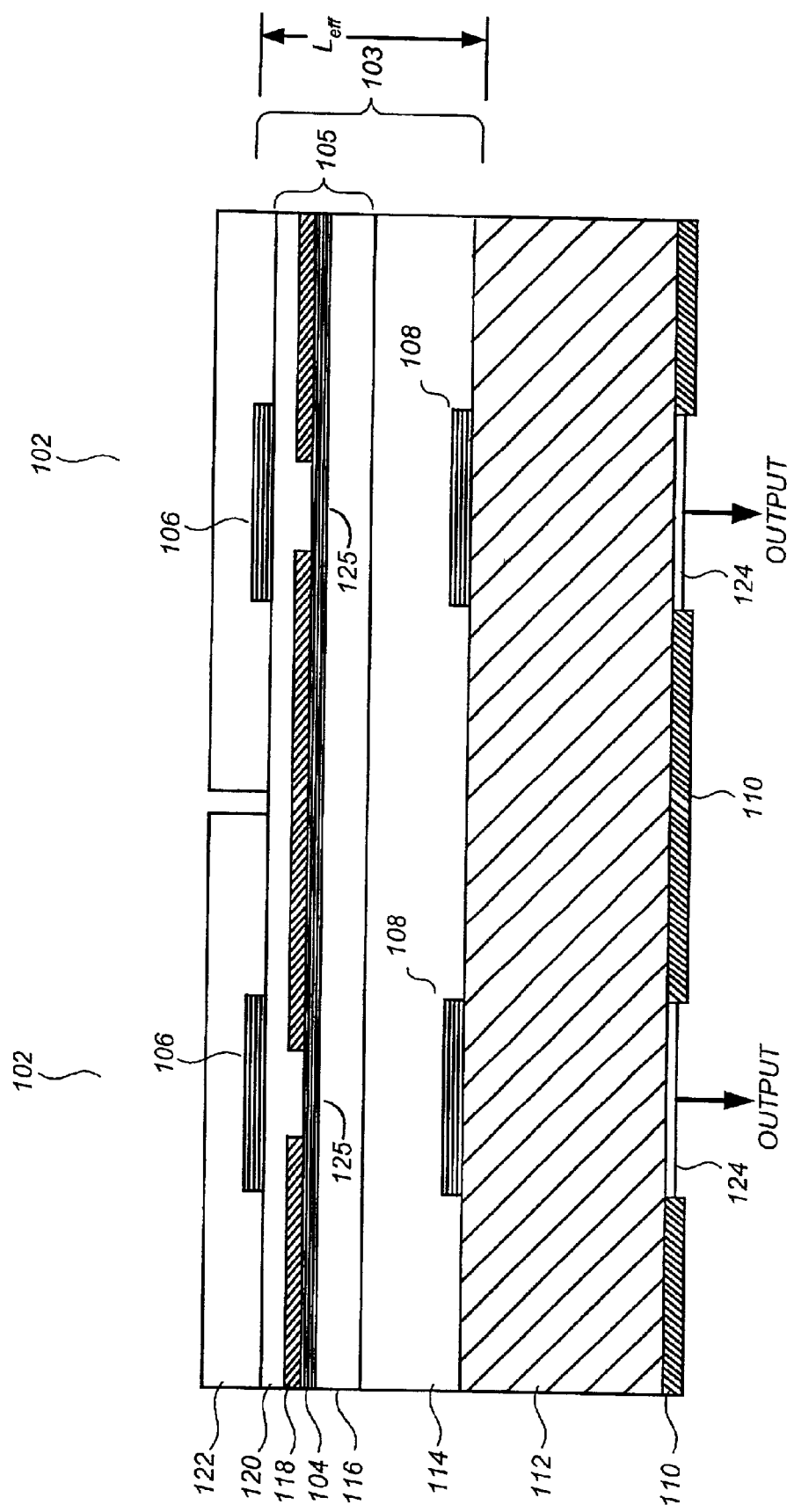
FIG. 1 illustrates a lateral cross-section of a VCSEL structure in accordance with a preferred embodiment.

FIG. 1 illustrates a lateral cross-section of a VCSEL structure in accordance with a preferred embodiment. More particularly, for clarity of disclosure, two side-by-side VCSEL structures 102 are shown, it being understood that many such structures will be placed on a single wafer. After fabrication, the VCSEL structures 102 may be cleaved and separately packaged, or may be packaged together into a single array device. VCSEL 102 has a planar wafer structure formed on a substrate 112, which in this particular embodiment is InP. VCSEL 102 further comprises an amorphous dielectric lower DBR 108 formed on substrate 112 and an InP lateral overgrowth (LOG) spacer layer 114 formed thereon. A vertical cavity 103 is defined by the lower DBR 108 and an upper amorphous dielectric DBR 106, as shown in FIG. 1.

An active region 105 comprising a lower n-type cladding layer 116, a quantum well layer 104, and an upper p-type cladding layer 120 is formed on top of the spacer layer 114. Quantum well layer 104 is preferably a strained quantum well layer, the lower transparency and higher differential gain achievable with strained quantum wells being necessary to produce above-room-temperature operating long-wavelength VCSELs. Group III-V semiconductor materials emitting in a long wavelength range (e.g., 1300 nm–1550 nm) may be used, such as InGaAsP or AlInGaAs material systems. A proton- or oxygen-implanted current confinement structure 118 is formed in the upper cladding layer 120 for current confinement. Upper DBR 106 is formed on the upper cladding layer 120, and a top electrical contact 122 is formed as shown in FIG. 1 to establish electrical connectivity to the upper cladding layer 120. A bottom electrical contact 110 is formed on the bottom side of substrate 112 in a manner that forms an aperture 124, the aperture further comprising an antireflective coating.

In operation, a voltage is applied between the top electrical contact 122 and the bottom electrical contact 110. Keeping in mind that the current confinement structure 118 and the upper and lower DBRs 106 and 108 are non-conducting, electrical current flows from the top electrical contact 106, through a narrow current confinement region 125, around the lower DBR 108, and on to the bottom electrical contact 110. The vertical cavity 103 containing the active region 105 between upper and lower DBRs 106 and 108 begins lasing action when the current density through the quantum well 104 is sufficiently high in view of the DBR reflectivities and cavity losses. Output light is emitted out the bottom of the VCSEL 102 as drawn in FIG. 1.

It is to be appreciated that while a bottom-emitting VCSEL structure 102 having its n-type electrical contacts near the emitting surface is described, conversely-positioned electrical contact and/or top-emitting structures may be used. It is to be further appreciated that while the examples described herein comprise surface electrodes, an intra-cavity electrode architecture may also be used with the preferred embodiments. For simplicity and clarity of explanation, a VCSEL structure that uses buried proton or oxygen implantation as a current confinement method (current confinement structure 118) is described. It is to be appreciated, however, that any of a variety of current confinement structures (e.g., etched mesa, dielectric apertured, buried heterostructure, etc.) may be used in conjunction with the preferred embodiments; see generally Coldren et. al., "Introduction to VCSELs," from *Vertical Cavity Surface Emitting Lasers: Design, Fabrication, Characterization, and Applications*, Wilmsen et. al., eds., Cambridge University Press (1999), at Chapter 1, which is incorporated by reference herein.

Typically, any suitable epitaxial deposition method, such as molecular beam epitaxy (MBE), metal organic chemical vapor deposition (MOCVD), or the like is used to make all the required multiple layers if epitaxial DBR materials such as AlAs/GaAs or InGaAs/InP are used. However, according to a preferred embodiment, in order to accommodate amorphous dielectric DBR materials while still maintaining a single-growth process, amorphous deposition techniques are used to deposit the lower dielectric DBR, and then a lateral overgrowth technique is used to grow an InP spacer layer over the dielectric DBR layers.

Figure 2:
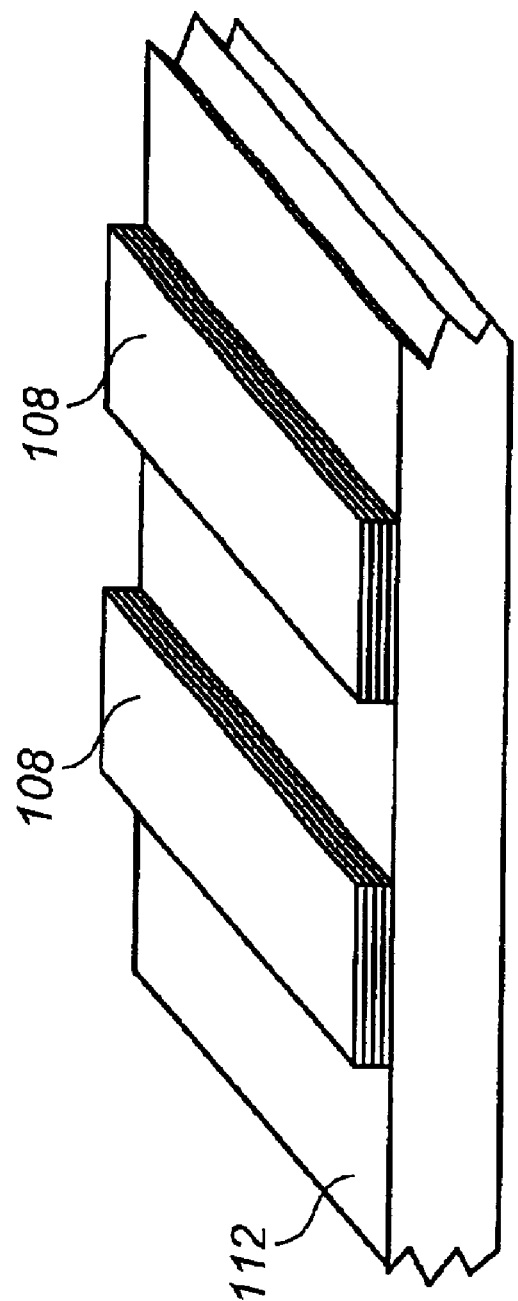
FIG. 2 illustrates a perspective cutaway view of two dielectric DBR stripes on an InP substrate.

FIG. 2 illustrates parallel DBR stripes 108 corresponding to the two VCSEL structures 102 of FIG. 1, lying on the InP substrate 112. The amorphous dielectric DBR 108 are deposited using amorphous deposition techniques, preferably along or around a certain crystal orientation, e.g. the (0-11) direction.

Figure 3:
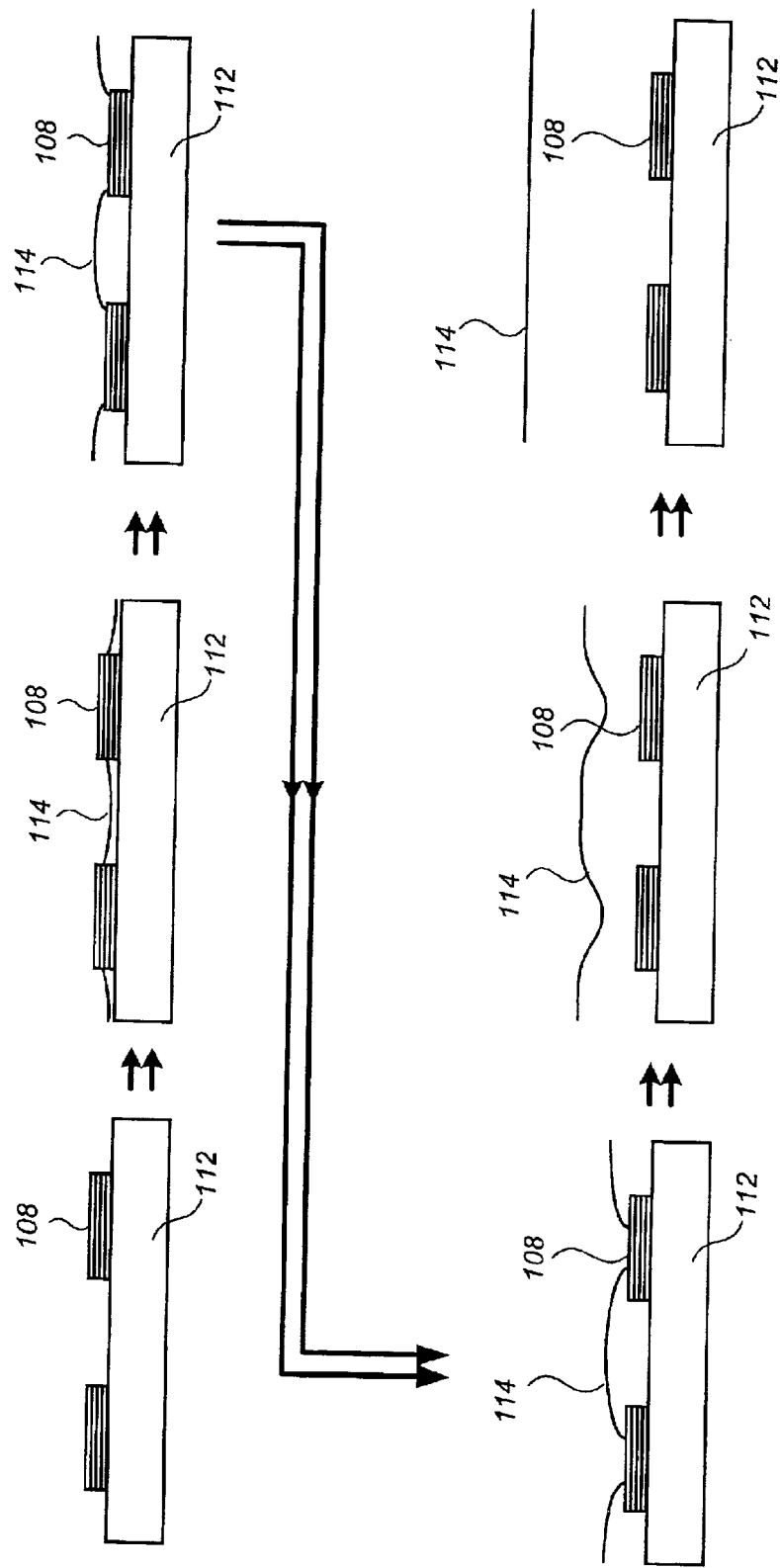
FIG. 3 illustrates a conceptual diagram of a lateral overgrowth process that forms a spacer layer above the dielectric DBRs of FIG. 2.

FIG. 3 conceptually illustrates the process of laterally overgrowing the spacer layer 114 on top of the lower DBR 108 and substrate 112, for two adjacent VCSELs 102 on a common wafer. Subsequent to the step of laying down the parallel DBR stripes 108, a lateral overgrowth layer 114 (hereinafter also referred to as the "LOG" layer) of InP is grown over the parallel DBR stripes from the transparent InP substrate 112. As known in the art of semiconductor processing, the LOG layer material will first grow vertically from the InP substrate and then gradually grow horizontally over the dielectric DBR region, as indicated in FIG. 3. Subsequent to this step, the VCSEL active layers 105 are grown on the LOG InP layer 114, using conventional epitaxial growth methods. The top DBR mirror 106, which is also preferably made of an amorphous dielectric material, is then deposited on top of the active region 105 to form the structure of FIG. 1.

As discussed in Babic et. al., "Long-Wavelength Vertical-Cavity Lasers," from *Vertical Cavity Surface Emitting Lasers: Design, Fabrication, Characterization, and Applications*, Wilmsen et. al., eds., Cambridge University Press (1999), at Chapter 8, which is incorporated by reference herein, an amorphous dielectric DBR structure such as an $Si/SiO_2$ structure is highly efficient as compared to AlAs/GaAs or InGaAs/InP structures, reaching a 99% reflectivity even when only a few quarter-wave layers (e.g. 4–6 layers) are present. For fabricating the preferred embodiment of FIG. 1, the spacer layer 114 is grown to a sufficient thickness such that substantial flatness is achieved and such that, when the active region 105 is subsequently formed using known methods, the overall length of the vertical cavity 103 will be the desired thickness. Because the InP lying above the DBR 108 it is laterally overgrown, there are fewer dislocations in this area as compared to InP that is not laterally overgrown. Thus, in addition to accommodating amorphous dielectric DBRs within a single-growth VCSEL, the laterally-grown spacer layer 114 has advantageous optical and electrical properties associated with reduced-dislocation InP material such as lower optical losses and lower electrical resistivity for better thermal performance.

Some of the salient features of VCSEL fabrication and the resulting VCSEL are noted herein. In a preferred embodiment, dielectric DBRs are used as both the top and bottom cavity mirrors. The reflectivity and the stop-band width of the mirrors are proportional to the refractive index difference between the higher-index and lower-index layers in DBR mirror. One of advantages of dielectric DBR mirrors is that a large refractive index difference between layers can be readily achieved, which produces high reflectivity mirrors only relatively few of dielectric stacks. See, e.g. Lei, C. et. al. "ZnSe/CaF2 quarter wave Bragg reflector for the vertical-cavity surface-emitting laser," J. Appl. Phys., vol. 69, pp. 7430–7434 (1991), which is incorporated by reference herein. Therefore, the effective cavity length $L_{eff}$ can be shortened by using dielectric DBRs as compared to semiconductor DBRs.

Lateral overgrowth (LOG) technology also ensures the growth of high-quality, reduced-dislocation crystal layers above the dielectric DBR stripes from the substrate. Advantageously, it has been shown that lateral overgrowth technology has an inherent mechanism to relieve stress caused by both lattice mismatches and differences in thermal expansion coefficients. See, e.g. Naritsuka, S. et. al., "InP layer grown on (001) Silicon substrate by epitaxial lateral overgrowth" Jpn. J. Appl. Phys. Vol. 34, pp. L1432–L1435 (1995), which is incorporated by reference herein. Therefore, epitaxial layers grown by LOG technology exhibit high crystal quality with very low dislocation density.

The employment of lateral overgrowth technology for creating the spacer region above the dielectric DBR has an additional advantage that a variety of materials may be used for the substrate and the spacer layer without sacrificing quality of the crystal layers. By way of nonlimiting example, heterogeneous epitaxial growth may be used for overgrowth of InP from an Si substrate, Ge from a Si substrate, or GaN from a Si substrate. See Kung, P. et. al., "Lateral epitaxial overgrowth of GaN films on sapphire and silicon substrates," Applied Physics Letters, Vol. 74, No. 4, pp. 570–2 (1999), Ohmachi, Y. et. al., "GaAs/Ge Crystal growth on Si and $SiO_2$ substrates," Mat. Res. Soc. Symposium Proc. Vol. 67, pp. 63–75 (1986), Sun, Y. "Temporally resolved growth of InP in the openings of off-orientation from [110] direction," 2000 International Conference on Indium Phosphide and Related Materials, pp. 227–230 (2000), which are incorporated by reference herein.

Figure 4:
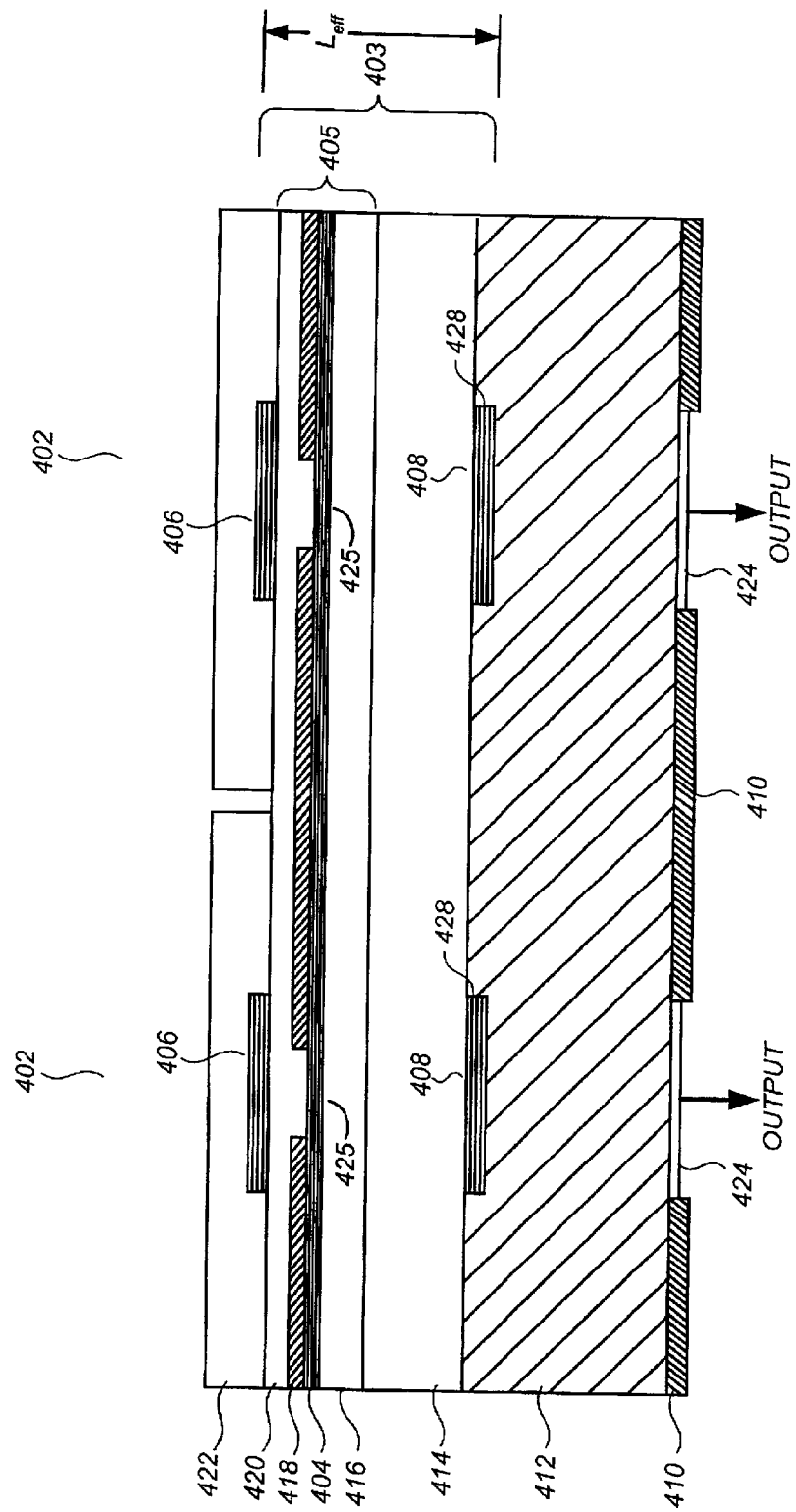
FIG. 4 illustrates a cross-section of a VCSEL in accordance with a preferred embodiment.
Figure 6:
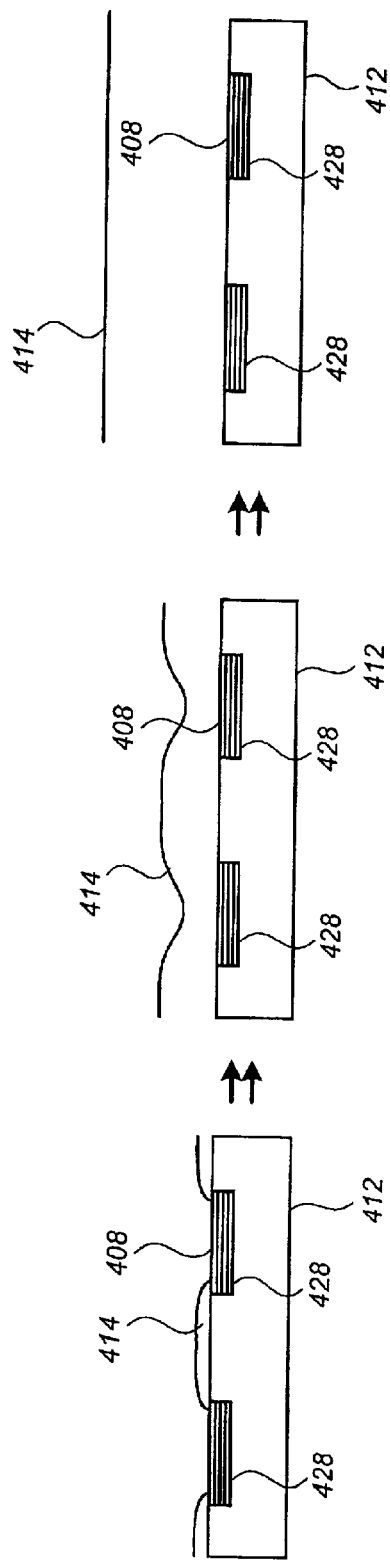
FIG. 6 illustrates a conceptual diagram of a lateral overgrowth process that forms spacer layers above the dielectric DBR stripes of FIG. 5A.

FIG. 4 illustrates a cross-section of a VCSEL 402 in accordance with another preferred embodiment. VCSEL 402 comprises elements 403–425 similar to elements 103–125 of the VCSEL 102 of FIG. 1 with exceptions as noted herein, the primary exception being that the lower DBR 408 is deposited in a well 428 that is first formed in the substrate 412. FIGS. 5A and 5B illustrate closer looks at the DBR 408 and DBR well 428 according to the preferred embodiments. FIG. 6 illustrates a conceptual diagram of the process of laterally overgrowing the spacer layer 414 on top of the lower DBR 408 and substrate 412.

Due to the lateral nature of its growth, the coalescence and atomic flatness of the lateral-growth layer above the dielectric DBR will be perfected only after growth of certain thickness of that layer. Accordingly, a relatively long cavity may be required in the device of FIG. 1. The long cavity may give rise to a lower side-mode suppression ratio and a higher optical diffraction loss, both of which need to be considered. See, e.g., Sale, "Vertical cavity surface emitting lasers," supra. Although the lower DBR 108 is relatively thin, perhaps one to two wavelengths thick, it is preferable to bury it in the InP substrate 112 prior to initiation of the lateral overgrowth process, such that the top surface of the lower DBR 108 is even with, or slightly below, the surface of the InP substrate 112. This concept is implemented in the VCSEL 402 of FIG. 4. This allows for the top of the lateral overgrowth layer to become very flat very quickly, as shown in FIG. 6.

In order to avoid longer cavity length, FIG. 4 illustrates a modified structure in which parallel grooves or wells 428 are first formed on the substrate, and the dielectric DBRs 408 are deposited in the wells 426. The wells 428, preferably formed along or around the (0-11) crystal orientation, are made on the substrate by either dry etching or wet etching. In the preferred embodiment of FIGS. 4–6, the depth of the grooves or wells is approximately the same as the thickness of the dielectric DBR. According to another preferred embodiment (see FIG. 7, infra) the wells are deeper than the thickness of dielectric DBRs deposited.

For the device of FIG. 4, the dielectric DBRs 408 are deposited on the areas of the wells 428, as shown in FIG. 6. The LOG InP epitaxial layer 414 is grown over the buried dielectric DBRs parallel stripes starting from the substrate. Using this method, the coalescence and planarity of InP layer happens at earlier stage of the growth than for the device of FIG. 1. The active layers 405 VCSELs are then grown on the LOG InP epitaxial layer 414, and the top dielectric DBR 406 is deposited on the active layers aligning with the bottom dielectric DBR 408.

In accordance with another preferred embodiment, the cavity length may be reduced after the growth of the LOG InP layer by adding a chemical-mechanical polishing step. Upon polishing the LOG InP layer 414 down to its desired value, the active layers 405 are grown and top dielectric DBR 406 deposited.

One requirement for the grooves or wells is that the bottom surface should be flat and smooth, suitable to deposition of dielectric DBRs and a second requirement is that the walls should be vertical (FIG. 5A) or non-reentrant (FIG. 5B) to meet the lateral overgrowth condition. Indeed, the effect of mesa shape on the planarity of InP selective re-growths by metal-organic vapor phase epitaxy (MOVPE) has been studied, and experimental results show that a reproducible planar re-growth can be achieved only when the mesa is non-reentrant. See Zilko, "Effect of mesa shape on the planarity of InP regrowths performed by atmospheric pressure and low pressure selective metalorganic vapor phase epitaxy," J. Crystal Growth, vol. 109, pp. 264–271 (1991), which is incorporated by reference herein. Proper chemical etchants known in the art are used to obtain the desired non-reentrant wall shape.

Figure 7:
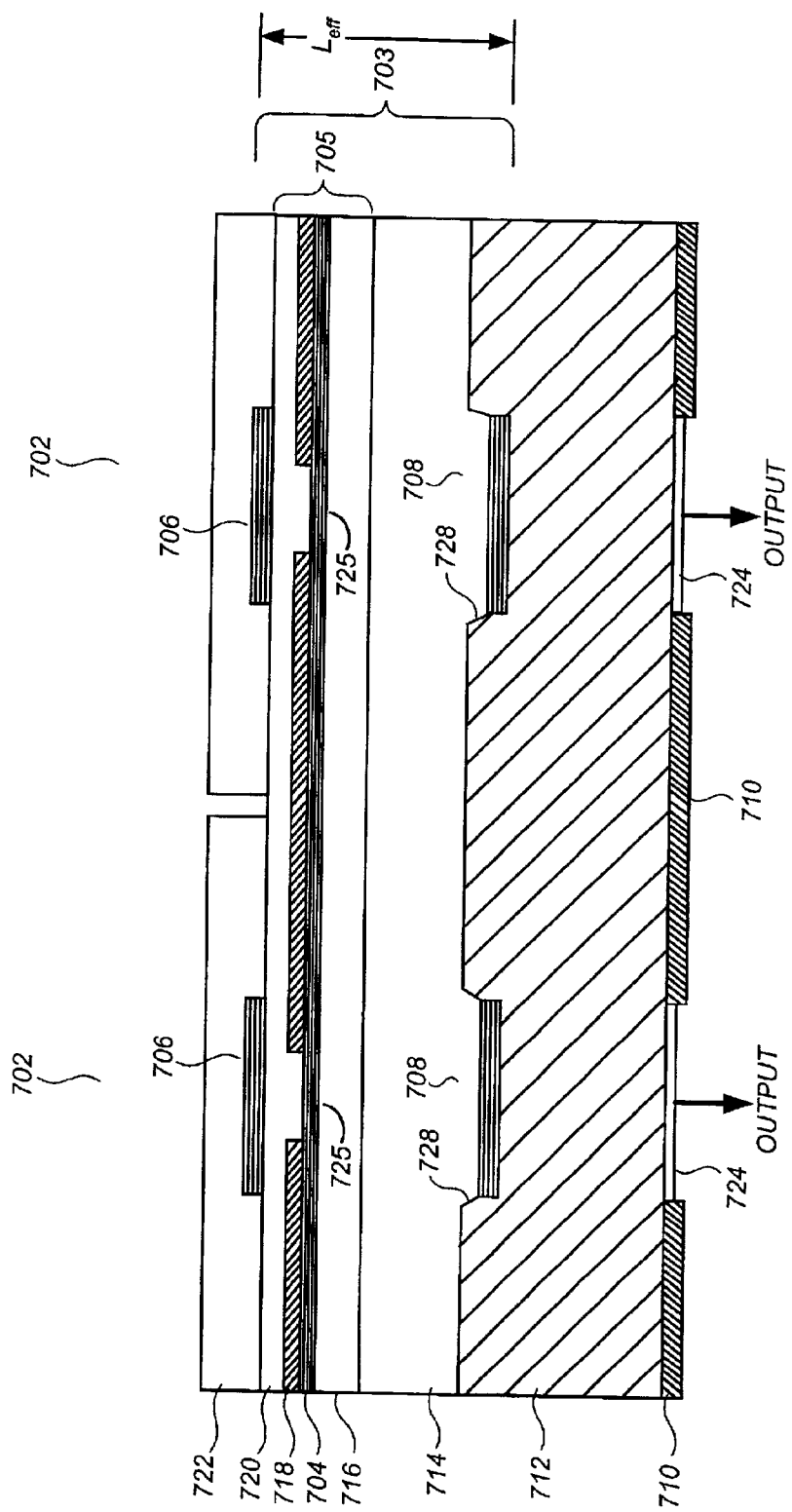
FIG. 7 illustrates a cross-section of a VCSEL in accordance with a preferred embodiment.

FIG. 7 illustrates a cross-section of a VCSEL 702 in accordance with another preferred embodiment. VCSEL 702 comprises elements 703–728 similar to elements 403–428 of the VCSEL 402 of FIG. 4 with the exception that the depth of the well 728 is greater than the thickness of dielectric DBRs deposited. This provides for even faster achievement of planarization of the LOG spacer layer 714, allowing that layer to be even thinner if required.

Moreover, the growth and processing technologies for formation of a VCSEL in accordance with the preferred embodiments are generally conventional and available. Thus, the time and cost savings associated with large-scale wafer-level manufacturing and testing are realizable. In the course of device fabrication, reduced stress is built in the structure close to the active layers, and accordingly the devices should have better temperature characteristics and exhibit increased reliability.

Some salient points of a fabrication process according to the preferred embodiments are now presented. The basic fabrication process for the device may be summarized as follows. The sequence of the processing steps may be changed in some cases. First, form a one-dimensional array of parallel grooves along or around certain crystal orientation, e.g. (0-11), on a substrate that is transparent to the lasing wavelength, e.g., InP, by either dry or chemical etching. In some conditions, a slight angular deviation from a certain low index direction was shown to be able to enhance the lateral overgrowth rate and benefit the planarity of the layer grown. See Park, J., "Lateral overgrowth and epitaxial lift-off of InP by halide vapor-phase epitaxy," J. Crystal Growth, vol. 187, pp. 185–193 (1998), which is incorporated by reference herein. A substrate with an etch stop layer may be used for chemical etching. The depth of the groove is preferably larger than the thickness of dielectric DBRs deposited later.

Dielectric DBRs are then deposited on the groove area. The thickness of each DBR layer is determined by the lasing wavelength and the refractive index of layer. The dielectric DBRs can be also deposited on the wafer substrate directly if the basic structure of FIG. 1 is used. An InP layer is then laterally overgrown on the dielectric DBRs from the substrate until the planarity of that layer's surface is reached. Optionally, the additional chemical-mechanical polishing step described supra for shortening the cavity length may then be performed, in which the LOG InP epitaxial layer is lapped and polished down to a desired thickness. A VCSEL active layer structure is then formed comprising a top contact layer, upper and lower cladding layers, and active layers by a conventional epitaxial growth technology, e.g., metal-organic chemical vapor deposition (MOCVD). In one example, an AlGaInAs/InP strained quantum-well structure can be used for uncooled long-wavelength VCSELs. See Zah, C. E., "High-performance uncooled 1.3 um AlxGayIn1-x-yAs/InP strained-layer quantum-well lasers for subscriber loop applications," IEEE J. Quantum Electron., vol. 30, pp. 511–523 (1994), which is incorporated by reference herein.

A current confinement structure is formed on the upper cladding layer by (i) ion implantation, (ii) hole defined oxidation (See Chua et. al., "Planar laterally oxidized vertical-cavity lasers for low threshold high density top surface emitting arrays", IEEE Photonics Technology. Letters., vol. 9, pp. 1060–1061, (1997), (iii) a "buried-mesa" method similar to the method described in commonly assigned U.S. Provisional Patent Application Ser. No. 60/278,715, filed Mar. 26, 2001, and converted to a non-provisional patent application Ser. No. 10/106,991 concurrently with this patent application, which is incorporated by reference herein, or by a combination of (i)–(iii) above.

An ohmic ring contact is formed on the top contact layer, e.g. by a process including deposition and alloying. A top DBR, preferably dielectric, is deposited in alignment with the bottom DBR. Gold (Au) is electroplated on the top surface by depositing an Au field and pattern electroplating area, and electroplating. A wafer flip-chip bond is formed on a handling wafer. The wafer substrate is lapped down and its surface is polished. An ohmic contact is made leaving a laser output aperture on the substrate side. An antireflective coating is deposited on the output aperture. The device wafer is removed from the handling wafer and scribed to device chips.

Other methods that may be used alternatively and/or in conjunction with the preferred embodiments are discussed in the following references, which are incorporated by reference herein: Jayaraman, V. et. al. "Uniform threshold current, continuous wave, single-mode 1300 nm vertical cavity lasers from 0–70C," Electronics Letters., vol. 34, pp. 1405–1407,(1998); Kondow, M. et. al., "GaInAsN: A novel material for long wavelength range laser diodes with excellent high-temperature performance", et al, Japan J. Appl. Phys., vol. 35, p. 1273–1275, (1996); and Anan, T. et. al., "Room temperature pulsed operation of GaAsSb/GaAs vertical-cavity surface-emitting lasers", Electronics Letters, vol. 35, pp. 903–904 (1999).

Figure 8:
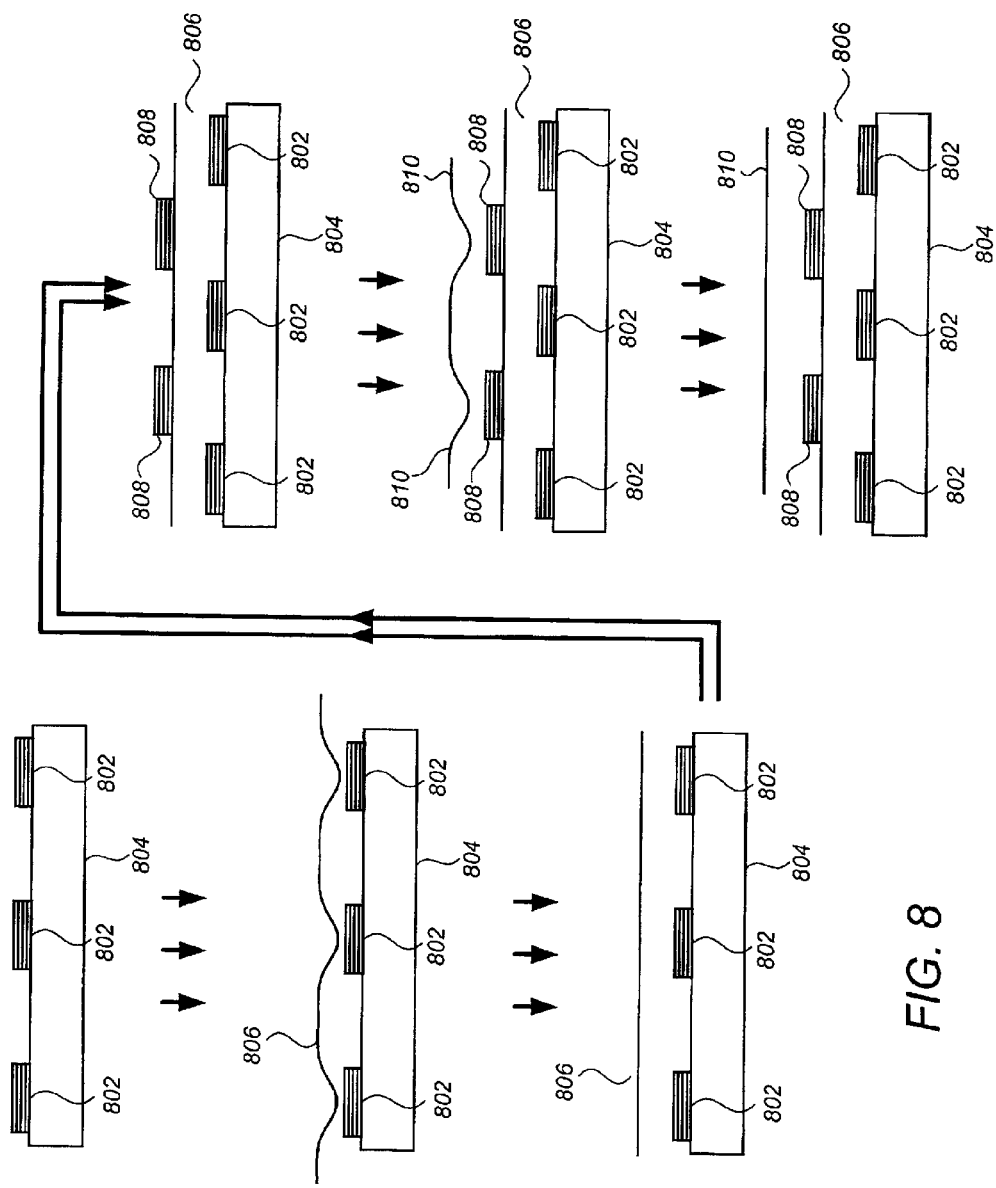
FIG. 8 illustrates a conceptual diagram of a dual lateral overgrowth process according to a preferred embodiment.

FIG. 8 illustrates a conceptual diagram of the formation of a lower DBR and spacer layer of a VCSEL according to another preferred embodiment. In this preferred embodiment, in a circumstance in which heterogeneous epitaxial growth is used, an optional step for producing even better crystalline structure with even fewer dislocations may be achieved by performing a second deposition of a second dielectric DBR on top of the first LOG layer, laterally offset from the first dielectric DBR, followed by the step of epitaxially growing a second LOG layer from the first LOG layer above the second dielectric DBR. Fewer dislocations are experienced after this multiple-lateral overgrowth process, as there have now been two lateral growths instead of one.

In the example of FIG. 8, dummy DBRs or other suitable amorphous elements 802 are deposited on a substrate 804. A first-generation LOG layer 806 is epitaxially grown thereover. Following this step, lower DBRs 808 are deposited on the first-generation LOG layer 806, and a second-generation LOG layer 810 is grown thereover. Active regions, current confinement structures, upper DBRs, upper electrical contacts, and lower electrical contacts (not shown) are then formed using the methods described supra. The LOG layers of the resulting VCSEL structures have even better crystalline structures with even fewer dislocations, thereby enhancing device performance.

It is to be appreciated that the lower DBRs 808 are not necessarily required to occupy different lateral spaces than the dummy DBRs 802. In other preferred embodiments, there is some amount of lateral overlap between the lower DBRs 808 and the dummy DBRs 802 provided that there is sufficient lateral room for lower electrical contacts and an exit aperture. In still other preferred embodiments, the dummy DBRs and/or the real DBRs may be deposited within wells formed in the underlying material so as to facilitate the lateral overgrowth process thereabove.

Whereas many alterations and modifications of the present invention will no doubt become apparent to a person of ordinary skill in the art after having read the foregoing description, it is to be understood that the particular embodiments shown and described by way of illustration are in no way intended to be considered limiting. By way of example, it is to be appreciated that a person skilled in the art would be readily able to adapt the methods and structures of the preferred embodiments to both top and bottom-emitting VCSELs. By way of further example, it is to be appreciated that a person skilled in the art would be readily able to adapt the methods and structures of the preferred embodiments to VCSELs having a top semiconductor DBR, to VCSELs having any of a variety of different current confinement mechanisms (e.g., hole defined oxidation, "buried" mesa), to VCSELs having a variety of different wavelengths and active region materials and structures, and generally to many different kinds of VCSELs. In still other preferred embodiments, VCSELs are fabricated according to methods and architectures described in the commonly assigned, copending U.S. patent application Ser. No. 09/927,802, filed Aug. 10, 2001, which is incorporated by reference herein. Therefore, reference to the details of the preferred embodiments are not intended to limit their scope, which is limited only by the scope of the claims set forth below.

What is claimed is:

1. A vertical cavity surface emitting laser (VCSEL), comprising:
    a substrate comprising a first semiconductor material;
    a first distributed Bragg reflector (DBR) mirror formed on said substrate, said first DBR mirror comprising an amorphous dielectric material;
    a lateral overgrowth (LOG) spacer layer epitaxially grown from the substrate and laterally extending over the first DBR mirror;
    an active region formed above said LOG spacer layer and epitaxially grown therefrom; and
    a second DBR mirror deposited above said active region;
    said VCSEL comprising an inner region vertically coincident with said first DBR and an outer region not vertically coincident with said first DBR, said LOG spacer layer having an inner region component and an outer region component, said inner region component being formed as a result of a lateral epitaxial growth process and having fewer material dislocations than said outer region component.

2. The VCSEL of claim 1, wherein said first DBR is deposited on a substantially flat surface of said substrate and rises thereabove, a top surface of said DBR lying in a first plane, a top surface of the substrate in said outer region lying in a second plane below said first plane.

3. The VCSEL of claim 1, wherein said first DBR is deposited in a well of said substrate, and wherein said well has a thickness approximating a thickness of said first DBR, a top surface of said DBR being substantially coplanar with a top surface of the substrate in said outer region.

4. The VCSEL of claim 1, wherein said first DBR is deposited in a well of said substrate, and wherein said well has a thickness greater than a thickness of said first DBR, a top surface of said DBR lying in a first plane, a top surface of the substrate in said outer region lying in a second plane above said first plane.

5. The VCSEL of claim 1, wherein said substrate and said LOG spacer layer each comprise InP.

* * * * *